(12) United States Patent
Lakhani et al.

(10) Patent No.: US 6,842,380 B2
(45) Date of Patent: Jan. 11, 2005

(54) METHOD AND APPARATUS FOR ERASING MEMORY

(75) Inventors: Vinod Lakhani, Palo Alto, CA (US); Tz-Yi Liu, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,597

(22) Filed: Aug. 27, 2002

(65) Prior Publication Data

US 2004/0042271 A1 Mar. 4, 2004

(51) Int. Cl.[7] .............................................. G11C 16/04
(52) U.S. Cl. .......................... 365/185.29; 365/185.33; 365/185.18; 365/218; 365/185.27; 365/185.01
(58) Field of Search ...................... 365/185.29, 185.33, 365/185.18, 218, 185.27, 185.01

(56) References Cited

U.S. PATENT DOCUMENTS

| | | | | |
|---|---|---|---|---|
| 5,084,843 A | * | 1/1992 | Mitsuishi et al. | 365/218 |
| 5,323,351 A | * | 6/1994 | Challa | 365/218 |
| 5,926,418 A | * | 7/1999 | Wong | 365/185.28 |
| 5,940,324 A | * | 8/1999 | Chi et al. | 365/185.27 |
| 6,344,995 B2 | | 2/2002 | Chen et al. | 365/185.18 |
| 6,344,996 B2 | | 2/2002 | Tanaka et al. | 365/185.18 |
| 6,344,999 B1 | | 2/2002 | Iwahashi | 365/185.24 |
| 6,345,000 B1 | | 2/2002 | Wong et al. | 365/185.29 |
| 6,345,367 B1 | | 2/2002 | Sinclair | 714/7 |
| 6,487,120 B2 | * | 11/2002 | Tanzawa et al. | 365/185.18 |

* cited by examiner

*Primary Examiner*—Aule Phung
*Assistant Examiner*—N. Nguyen
(74) *Attorney, Agent, or Firm*—Williams, Morgan & Amerson

(57) ABSTRACT

The present invention provides a method and apparatus for erasing memory blocks. The apparatus includes a first plurality of memory cells formed in a substrate and a second plurality of memory cells formed in the substrate. The apparatus further includes a bias circuit adapted to provide an erasing voltage differential to the first plurality of memory cells and a compensating voltage differential to the second plurality of memory cells, wherein the erasing voltage differential is larger than the compensating voltage differential.

55 Claims, 7 Drawing Sheets

METHOD AND APPARATUS FOR ERASING MEMORY

BACKGROUND OF THE INVENTION

1. Field of the Invention

This invention relates generally to a semiconductor memory array, and, more particularly, to a method for erasing memory in semiconductor memory arrays and an apparatus for accomplishing this method.

2. Description of the Related Art

Memory arrays in modern integrated circuit devices may be comprised of a plurality of memory cells formed above a semiconductor substrate, such as silicon. For example, a semiconductor memory array may include 256K (256× 1024) memory cells. Electrically conducting lines may also be formed in the semiconductor substrate and coupled to the memory cells. Bits of data may be stored in the memory cells, for example, by providing electric voltage or current to a plurality of bit lines and a plurality of orthogonal word lines that may be electrically coupled to the memory cells.

The memory cells may be formed from a variety of non-volatile components, such as the floating gate transistors used to form flash memory cells. While volatile memory cells such as dynamic random access memory may need to be periodically refreshed by providing additional electrical current, non-volatile memory cells may retain information for relatively long periods without a need to be refreshed. Furthermore, flash memory cells may be erased in blocks including multiple memory cells, unlike volatile memory cells, which are typically erased one-by-one, and unlike other non-volatile memories, such as EPROMs, in which the entire memory array is normally erased at once. For example, a 128-Megabit flash memory device may include 256 blocks of 500K flash memory cells. Each flash memory block may be erased by applying a bias voltage to the semiconductor substrate in which the memory block is formed. Thus, each flash memory cell in the memory block may be erased with a single operation, in contrast to 500K operations that would be needed if the cells were to be erased one at a time.

To reduce the chance that the applied voltage used to erase one flash memory block may affect other semiconductor devices in other memory blocks formed in the same substrate, each of the flash memory blocks may be formed in a "p-tub." For example, if the substrate is formed of an N-type semiconductor, the p-tub may be formed by doping the area that will contain a memory block of cells using a P-type dopant. The flash memory block of cells within the p-tub may then be electrically isolated from other semiconductor devices that may be positioned outside of the p-tub, including flash memory cells in other memory blocks. However, there is a prescribed minimum space between p-tubs formed in the same semiconductor substrate due to limitations of the process technology. Consequently, placing each memory block of flash memory cells in a separate p-tub may reduce the number of flash memory blocks that may be formed in the semiconductor substrate.

SUMMARY OF THE INVENTION

In one aspect of the instant invention, an apparatus is provided for erasing memory. The apparatus includes a first plurality of memory cells formed in a substrate and a second plurality of memory cells formed in the substrate. The apparatus further includes a bias circuit adapted to provide an erasing voltage differential to the first plurality of memory cells and a compensating voltage differential to the second plurality of memory cells, wherein the erasing voltage differential is larger than the compensating voltage differential.

In one aspect of the present invention, a method is provided for erasing memory. The method includes providing an erasing voltage differential to a first plurality of memory cells formed in a substrate. The method further includes providing a compensating voltage differential to a second plurality of memory cells formed in the substrate at approximately the same time as the erasing voltage differential is provided to the first plurality of memory cells.

BRIEF DESCRIPTION OF THE DRAWINGS

The invention may be understood by reference to the following description taken in conjunction with the accompanying drawings, in which like reference numerals identify like elements, and in which.

Figure 1:
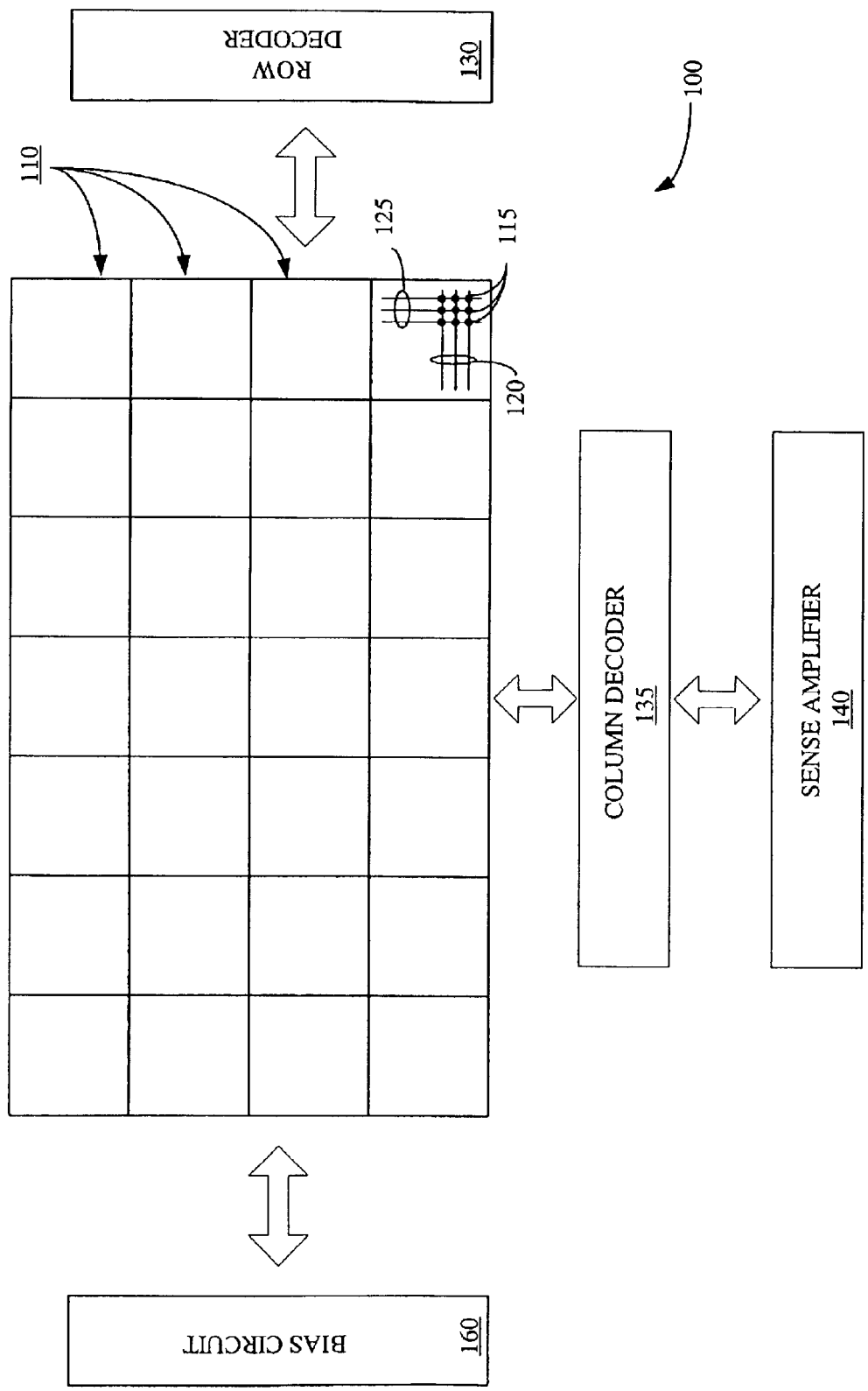
FIG. 1 shows a block diagram of an exemplary arrangement of a semiconductor memory array, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, an exemplary arrangement of a flash memory array 100 is shown. The flash memory array 100 includes a plurality of memory blocks 110, each including a plurality of flash memory cells 115. For example, a 128-Megabit flash memory array 100 may include 256 memory blocks 110, each including 500K flash memory cells 115. Each flash memory cell 115 may be coupled to a row line 120 and a column line 125. One or more selected flash memory cells 115 may be accessed by providing address signals to a row decoder 130 and a column decoder 135. Based on those signals, circuitry in the row decoder 130 and the column decoder 135 may select one or more row lines 120 and one or more column lines 125, which may correspond to the selected flash memory cells 115. In one embodiment, the column decoder 135 may be coupled to one or more sense amplifiers 140, which may read the logical state of the selected flash memory cells 115. The selection of flash memory cells 115 through the decoding of row and column addresses, as well as sensing the logical state of flash memory cells 115, are well known to those of ordinary skill in the art.

The flash memory cells 115 in each memory block 110 may also be coupled to a bias circuit 160. In one embodiment of the flash memory array 100, the row decoder 130 and the column decoder 135 may be used to select one or more memory blocks 110. The bias circuit 160 may then apply a voltage differential to the one or more selected memory blocks 110, substantially erasing the flash memory cells 115 in the selected memory blocks 110. For example, the bias circuit 160 may apply a voltage differential of 18 volts to substantially erase the selected memory blocks 110.

Figure 2:
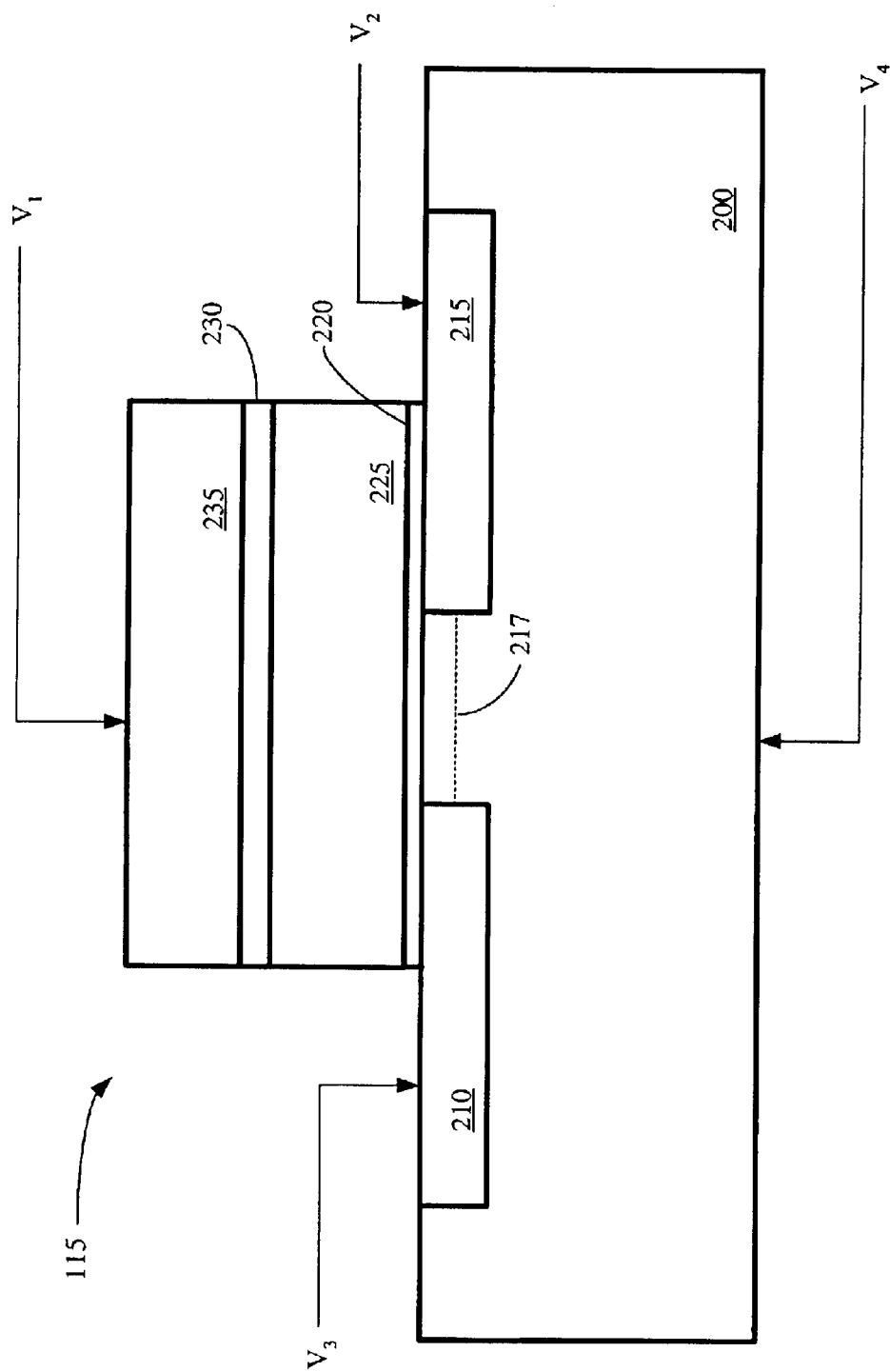
FIG. 2 shows a block diagram illustrating an exemplary flash memory cell, in accordance with one embodiment of the present invention.

Referring now to FIG. 2, a block diagram illustrating an exemplary flash memory cell 115 is shown. The flash memory cell 115 may include a source 210 and a drain 215 that may be formed in a substrate 200, which may be formed of a variety of semiconductor materials. For example, the substrate 200 may be an N-type semiconductor formed from silicon. A portion of the substrate 200 approximately between the source 210 and the drain 215, indicated in FIG. 2 by a dashed rectangle, will be referred to hereinafter as channel 217.

A first insulating layer 220 may be formed above the source 210, the drain 215, and the channel 217. In one embodiment, a floating gate 225 may be formed above the first insulating layer 220 and a second insulating layer 230 may be formed above the floating gate 225. A control gate 235 may then be formed above the first and second insulating layers 220, 230. In the interest of clarity, the techniques for forming the various gates and layers described above, which are well known to those of ordinary skill in the art and are not material to the present invention, will not be discussed herein.

To program one embodiment of the flash memory cell 115, a first voltage $V_1$ may be provided to the control gate 235. A second voltage $V_2$, which may be smaller than the first voltage $V_1$, may be provided to the drain 215. A third and a fourth voltage $V_3$, $V_4$, which may be smaller than the second voltage $V_2$, may be provided to the source 210 and the substrate 200, respectively. For example, a first voltage $V_1$ of about 8 volts may be provided to the control gate 235, a second voltage $V_2$ of about 4 volts may be provided to the drain 215, a third voltage $V_3$ of about 0 volts may be provided to the source 210, and a fourth voltage $V_4$ of about 0 volts may be provided to the substrate 200. The voltage of about 8 volts on the control gate 235 and the voltage differential of about 4 volts between the source 210 and the drain 215 will cause a current of electrons to flow through the channel 217 from the source 210 to the drain 215. As electrons flow through the channel 217, the voltage differential of about 8 volts between the control gate 235 and the substrate 200 will cause a portion of the electrons to jump from the channel 217 to the floating gate 225. The collected electrons in the floating gate 225 may be detected in a reading operation well known to those of ordinary skill in the art and determined to represent a logic-low state.

To erase one embodiment of the flash memory cell 115, the first voltage $V_1$ may be provided to the control gate 235. The third and fourth voltages $V_3$, $V_4$, which may be larger than the first voltage $V_1$, may be provided to the source 210 and the substrate 200, respectively. For example, the first voltage $V_1$ of about −9 volts may be provided to the control gate 235, the third voltage $V_3$ of about +9 volts may be provided to the source 210, and a fourth voltage $V_4$ of about +9 volts may be provided to the substrate 200. The voltage differential of about 18 volts between the control gate 235 and the substrate 200 may cause electrons in the floating gate 225 to jump to the substrate 200, thus discharging the floating gate 225. In one embodiment, the second voltage $V_2$ may be allowed to float.

Figure 3A:
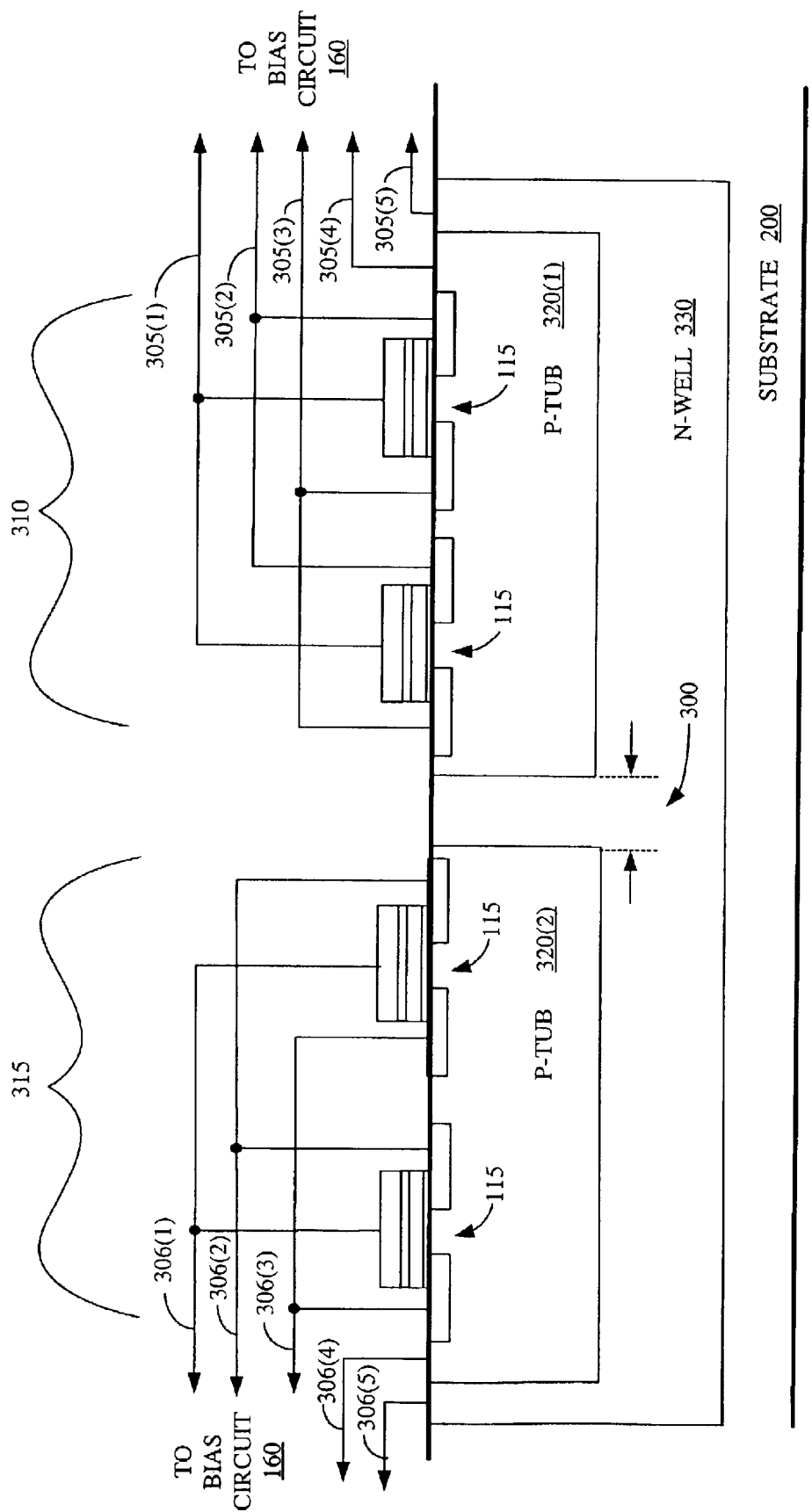
FIGS. 3A–B show block diagrams of exemplary arrangements of a plurality of memory blocks formed on a substrate, in accordance with one embodiment of the present invention.

FIG. 3A shows a block diagram of a plurality of memory blocks. The first memory block 310 and the second memory block 315 may be formed on a substrate 200. In one embodiment, the plurality of flash memory cells 115 in the first memory block 310 may be erased at substantially the same time using the lines 305(1–5) that may be coupled to the bias circuit 160. As described above, the first and third voltage may be provided to the plurality of flash memory cells 115 and the substrate 200 at substantially the same time such that the plurality of flash memory cells 115 in the first memory block 310 may be erased at substantially the same time. Similarly, the plurality of flash memory cells 115 in the second memory block 315 may be erased at substantially the same time using the lines 306(1–5) that may be coupled to the bias circuit 160.

Figure 3B:
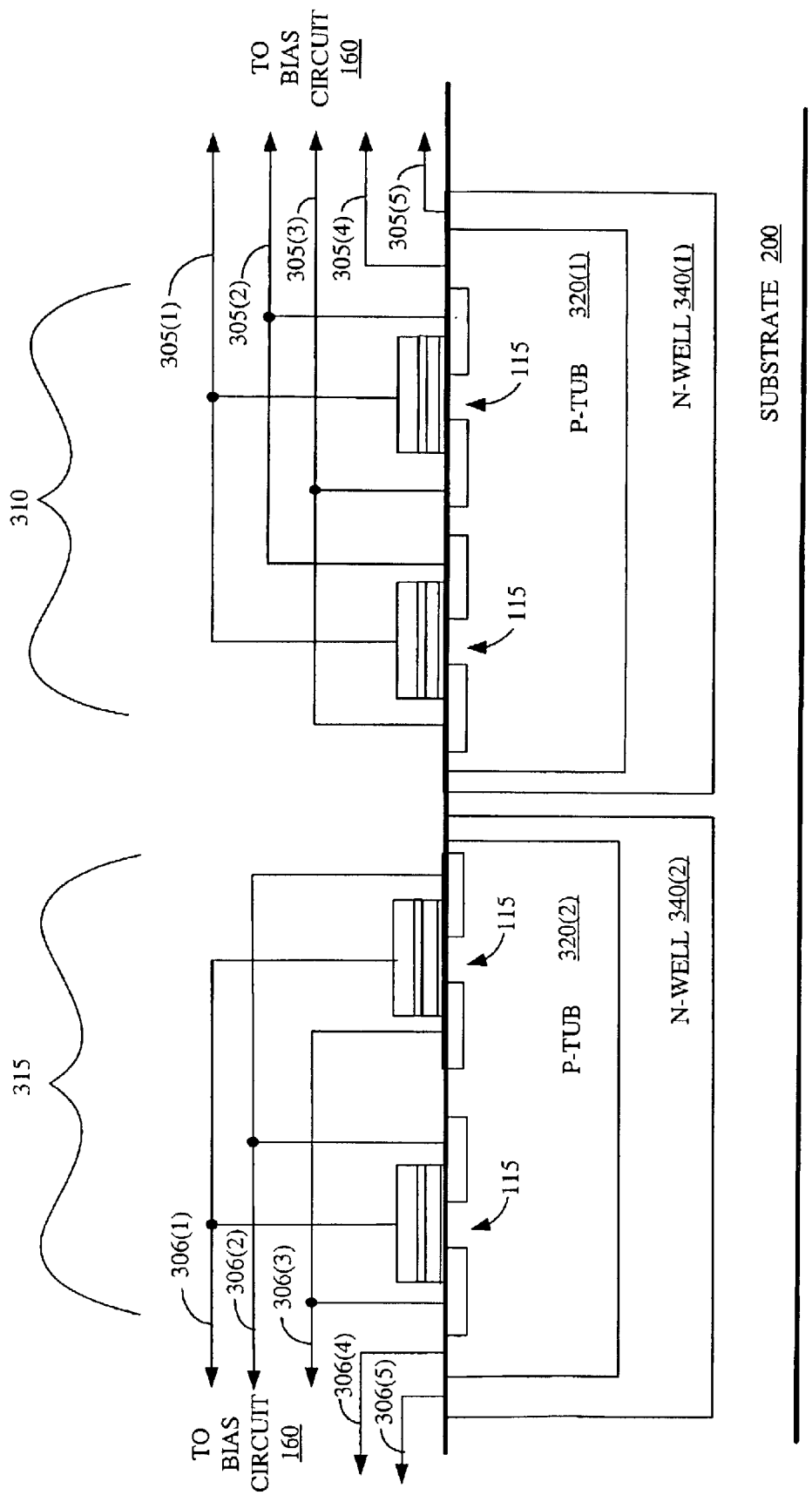

Unless adequate precautions are taken, the voltage differential that may be provided to the flash memory cells 115 in the first memory block 310 may erase or have other undesirable effects on at least some of the flash memory cells 115 in other memory blocks. For example, providing the first voltage $V_1$ of about −9 volts to the first memory block 310 and the third voltage $V_3$ of about +9 volts to the substrate 200 may erase one or more flash memory cells 115 in the second memory block 315. The voltage differential may also affect other electronic components, such as logic gates, diodes, and the like, that may be formed in the substrate 200. Thus, in one embodiment, the first and second memory blocks 310, 315 may be formed in separate p-tubs 320(1–2). For example, the p-tubs 320(1–2) may be P-type regions. The p-tubs 320(1–2) may, in one embodiment, be formed in a common n-well 330, which may be an N-type region formed in the substrate 200. In alternative embodiments, and as shown in FIG. 3B, the p-tubs may each be formed in a separate n-well 340(1–2).

By positioning the p-tubs 320(1–2) a selected distance 330 apart, the likelihood that the voltage differential provided to the first memory block 310 in the p-tub 320(1) will undesirably affect flash memory cells 115 or other components in the p-tub 320(2) may be reduced. For example, providing the first voltage $V_1$ of about −9 volts to the first memory block 310 via the line 305(1) and the fourth voltage $V_4$ of about +9 volts to the p-tub 320(1) via the line 305(4) may substantially erase the plurality of flash memory cells 115 in the first memory block 310, while leaving the plurality of flash memory cells 115 in the second memory block 315 substantially undisturbed. When erasing the plurality of flash memory cells 115, it may also be desirable to apply a voltage of +9 volts to the n-well 330 via the line 305(5).

However, the separation distance 300 may be undesirably large and may reduce the number of memory blocks 310, 315 and other semiconductor components that may be formed on a substrate 200. For example, a 500K memory block 310, 315 may have dimensions of about 80 microns by about 2300 microns, and a desirable separation distance 300 between p-tubs 320(1) and 320(2) may be about 6 microns.

To increase the number of memory blocks 310, 315 that may be formed on a single semiconductor substrate, it may be desirable to place a plurality of memory blocks 310, 315 in one p-tub 320(1). For example, 70 memory blocks 310, 315 may be placed in the p-tub 320(1) with substantially no separation distance 330 between the memory blocks 310, 315. One linear dimension of the p-tub 320(1) may thus be about 80 microns×70=5600 microns. If the 70 first memory block 310 is placed in separate p-tubs 320(1-2) with the separation distance 300 of 6 microns between the p-tubs 320(1-2), the linear dimension of the 70 p-tubs 320(1-2) may be increased by about 6 microns×69=414 microns. Consequently, in one embodiment, the linear dimension of the 70 memory blocks 310, 315 may be reduced by approximately 7% by placing 70 memory blocks 310, 315 in the p-tub 320(1).

However, in a manner similar to that discussed above, the voltage differential that may be provided to the flash memory cells 115 in the first memory block 310 may erase or have other undesirable effects on the flash memory cells 115 in the second memory block 315. Thus, in accordance with one embodiment of the present invention, when the voltage differential is applied to a selected one or more of a plurality of memory blocks 310, 315 in p-tubs 320(1-2), a compensating voltage differential may be applied to one or more unselected memory blocks 310, 315.

Figure 4:
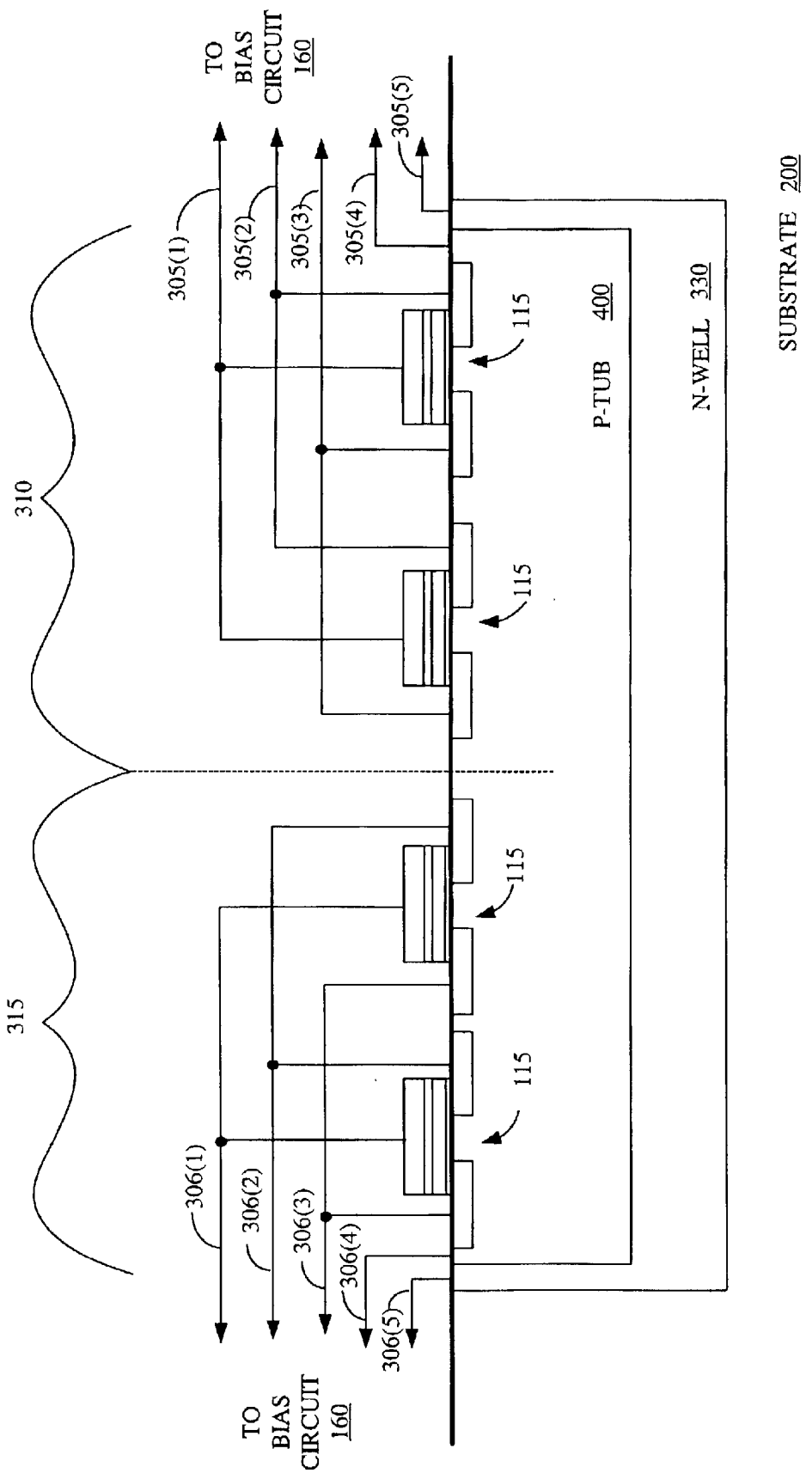
FIG. 4 shows a block diagram of an exemplary arrangement of memory blocks formed in a p-tub, in accordance with one embodiment of the present invention.

FIG. 4 shows a block diagram of an exemplary arrangement of memory blocks 310, 315 formed in a p-tub 400, in accordance with one embodiment of the present invention. As described above, the bias circuit 160 may program the flash memory cells 115 by providing a plurality of voltages to the flash memory cells 115 and the substrate 200 via the lines 305(1-5), 306(1-5). The bias circuit 160 may also provide the plurality of voltages to the lines 305(1-5) to erase all of the plurality of flash memory cells 115 in the first memory block 310 at substantially the same time. Similarly, the bias circuit 160 may also provide the plurality of voltages to the lines 306(1-5) to erase all of the plurality of flash memory cells 115 in the second memory block 315 at substantially the same time.

To reduce the likelihood that the voltage differential provided to the first memory block 310 may erase or have other undesirable effects on the flash memory cells 115 in the second memory block 315, the bias circuit 160 may provide a compensating voltage differential to the flash memory cells 115 in the second memory block 315, in accordance with one embodiment of the present invention. For example, the bias circuit 160 may provide a voltage of −9 volts to the flash memory cells 115 via the line 305(1) and a voltage of +9 volts to the p-tub 400 via the lines 305(4) and 306(4), as well as a voltage of +9 volts to the n-well 330 via the lines 305(5), 306(5), to erase the first memory block 310. By providing a voltage of about +9 volts to the control gates 235 of the flash memory cells 115 in the second memory block 315 via the line 306(1), the voltage differential between the control gates 235 of the flash memory cells 115 in the second memory block 315 and the p-tub 400 may be reduced to about zero.

Although two memory blocks 310, 315 are depicted in FIG. 4, the present invention is not so limited. In alternative embodiments, more memory blocks 310, 315 may be formed in the p-tub 400 without departing from the scope of the present invention. In one embodiment, for example, 70 memory blocks 310, 315 each including 500K flash memory cells 115 may be formed in the p-tub 400.

Figure 5:
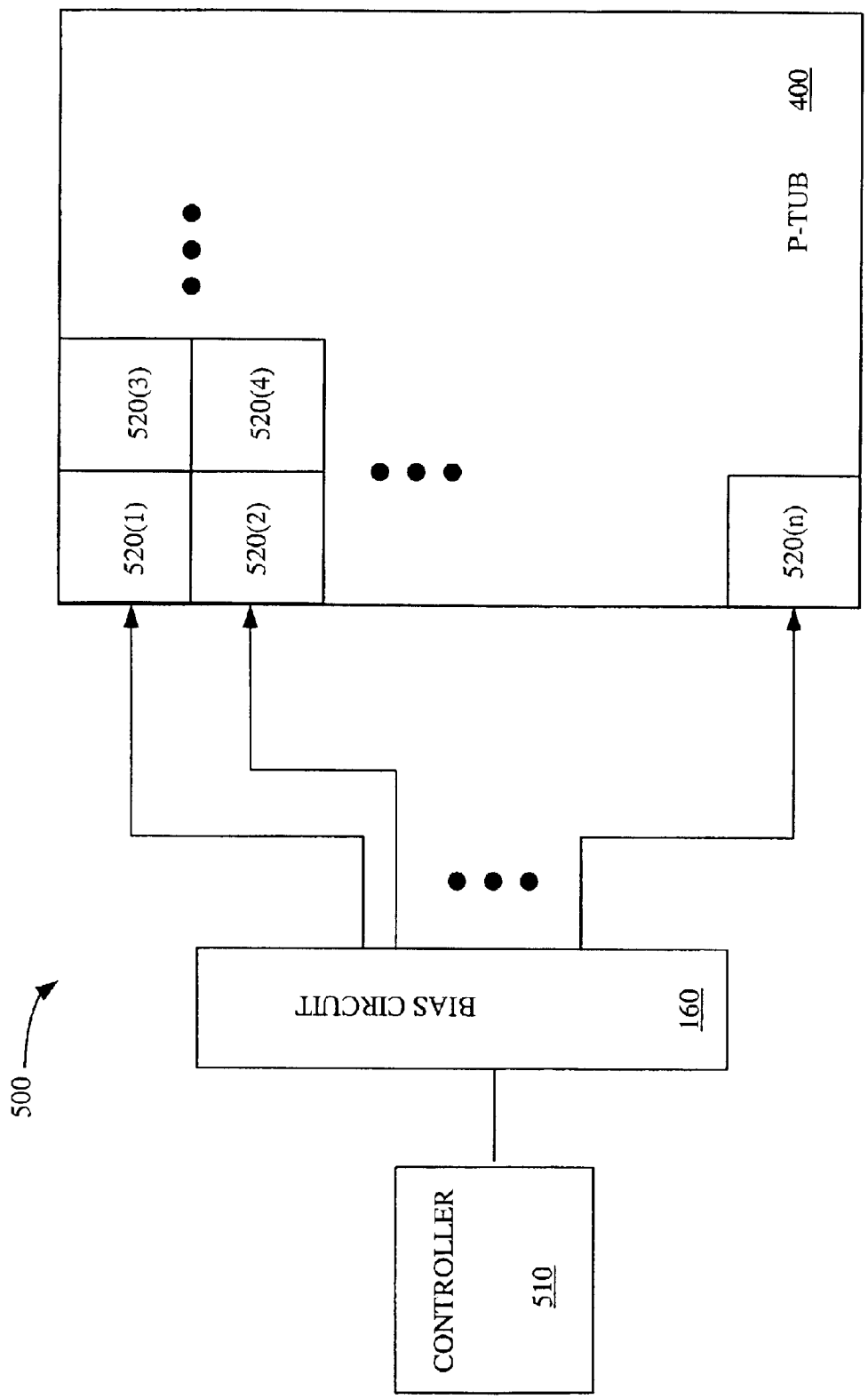
FIG. 5 shows a block diagram of a circuit that may be used to provide voltages to the p-tub and the memory blocks shown in FIG. 4, in accordance with one embodiment of the present invention.

FIG. 5 shows a block diagram of a circuit 500 that may be used to provide voltages to the p-tub 400, in accordance with one embodiment of the present invention. A controller 510 may be coupled to the bias circuit 160 and may select one or more memory blocks 520(1-n) in the p-tub 400. The bias circuit 160 may then provide voltage differentials to erase the selected memory blocks 520(1-n), as described above. Similarly, the bias circuit 160 may provide the compensating voltage differential to the unselected memory blocks 520(1-n) to reduce the likelihood that the voltage differential provided to the selected memory blocks 520(1-n) may erase or have other undesirable effects on the unselected memory blocks 520(1-n). For example, the controller 510 may select the memory block 520(1). The bias circuit 160 may provide the appropriate erasing voltage differential to the memory block 520(1) and may provide the appropriate compensating voltage differential to the unselected memory blocks 520(2-n). In this manner, every memory block 520(1-n) of flash memory cells 115 in the p-tub 400 will receive biasing voltages, either erasing bias voltages or compensating bias voltages. Hence, well-known techniques for selecting a memory block 520(1-n) of flash memory cells 115 may be used for applying the erasing biasing voltages, and all memory blocks 520(1-n), unless selected, would receive compensating biasing voltages.

Figure 6:
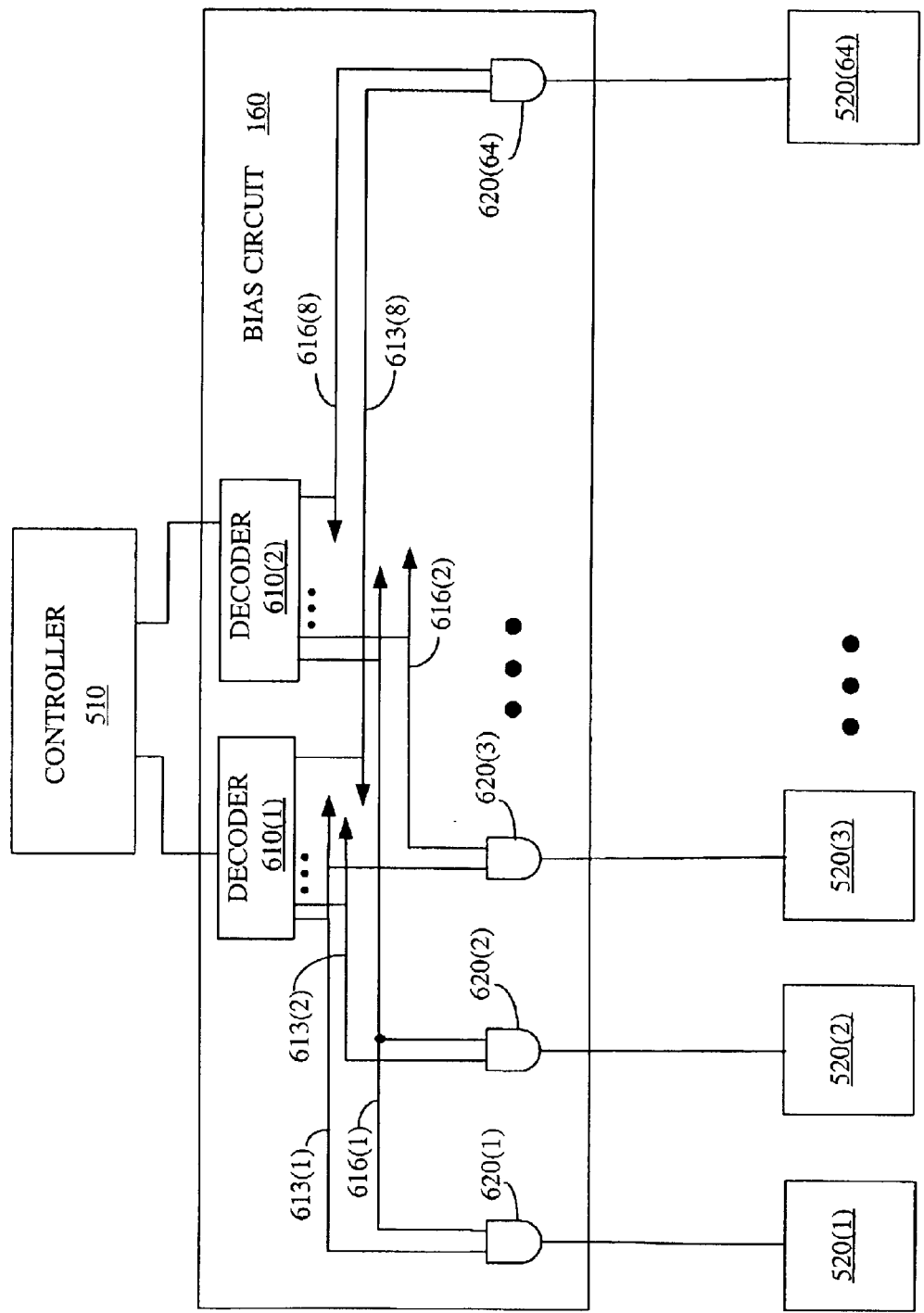
FIG. 6 shows a block diagram of a bias circuit that may be used to select memory blocks shown in FIG. 5, in accordance with one embodiment of the present invention.

FIG. 6 shows a block diagram of the bias circuit 160 that may be used to select one or more memory blocks 520(1-64), in accordance with one embodiment of the present invention. The bias circuit 160 may include one or more decoders 610(1-2) coupled to a plurality of logic gates 620(1-64) via one or more lines 613(1-8), 616(1-8). The logic gates 620(1-64) may be coupled to the memory blocks 520(1-64). Although not so limited, in one embodiment, the logic gates 620(1-64) may be AND gates. For the sake of clarity and ease of explanation, FIG. 6 shows two decoders 610(1-2), 64 logic gates 620(1-64), 16 lines 613(1-8), 616(1-8), and 64 memory blocks 520(1-64). However, it will be appreciated that the present invention is not so limited. In alternative embodiments, more or fewer decoders 610(1-2), lines 613(1-8), 616(1-8), logic gates 620(1-64), and memory blocks 520(1-64) may be deployed without departing from the scope of the present invention. Additional desirable elements may also be included in the bias circuit 160 without departing from the scope of the present invention.

To select a memory block 520(1-64), the controller 510 may provide a signal to the decoders 610(1-2), in accordance with one embodiment of the present invention. For example, the controller 510 may provide a first signal representing a "1" to the decoder 610(1) and a second signal representing a "1" to the decoder 610(2). The decoders 610(1-2) may decode the first and second signals and may then assert a logic-high signal to the lines 613(1) and 616(1), respectively. The decoders 610(1-2) may also assert a logic-low signal to the lines 613(2-8) and 616(2-8), respectively. The logic gate 620(1) may use the signals provided by the lines 613(1) and 616(1) to assert a logic-high signal to the memory block 520(1), which may use the asserted signal to provide an erasing voltage to the memory block 520(1). The unselected logic gates 620(2-64) may assert a logic-low signal that may be used to apply a compensating voltage to the unselected memory blocks 520(2-64).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
a first plurality of memory cells formed in a substrate;
a second plurality of memory cells formed in the substrate; and
a bias circuit adapted to provide an erasing voltage differential to the first plurality of memory cells and a compensating voltage differential to the second plurality of memory cells, wherein the erasing voltage differential is larger than the compensating voltage differential.

2. The apparatus of claim 1, wherein the compensating voltage differential is approximately zero.

3. The apparatus of claim 1, wherein the erasing voltage differential is formed by a first voltage provided to a control gate of the first plurality of memory cells, a second voltage provided to the substrate, and a third voltage provided to at least one of a source terminal and a drain terminal of the second plurality of memory cells.

4. The apparatus of claim 1, wherein the erasing voltage differential is selected to substantially erase the first plurality of memory cells.

5. The apparatus of claim 4, wherein the erasing voltage differential is between about 10 and about 20 volts.

6. The apparatus of claim 5, wherein the erasing voltage differential is about 18 volts.

7. The apparatus of claim 1, wherein the first plurality of memory cells is at least one block of memory cells.

8. The apparatus of claim 7, wherein the second plurality of memory cells is at least one block of memory cells.

9. The apparatus of claim 1, wherein the memory cells are non-volatile memory cells.

10. The apparatus of claim 9, wherein the non-volatile memory cells are flash memory cells.

11. The apparatus of claim 1, wherein the first plurality and the second plurality of memory cells are formed in a p-tub in the substrate.

12. The apparatus of claim 11, wherein the p-tub is formed in an n-well.

13. The apparatus of claim 12, wherein the substrate is a P-type semiconductor, the n-well is an N-type semiconductor, and the p-tub is a P-type semiconductor.

14. The apparatus of claim 1, wherein the bias circuit comprises at least one decoder adapted to select the first plurality of memory cells.

15. An apparatus, comprising:
a first block of non-volatile memory cells formed in a p-tub;
a second block of non-volatile memory cells formed in the p-tub; and
a bias circuit adapted to provide a first voltage differential to the memory cells in the first block and a second voltage differential to the memory cells in the second block by providing a first voltage to the memory cells in the first block, a second voltage to the p-tub, and a third voltage to the memory cells in the second block.

16. The apparatus of claim 15, wherein the first voltage differential is selected to substantially erase the first block of memory cells.

17. The apparatus of claim 16, wherein the first voltage differential is between about 10 and about 20 volts.

18. The apparatus of claim 17, wherein the first voltage differential is about 18 volts.

19. The apparatus of claim 15, wherein the second voltage is approximately equal to the third voltage, and the second voltage differential is approximately zero.

20. The apparatus of claim 19, wherein the p-tub is formed in a substrate.

21. The apparatus of claim 20, wherein the p-tub is formed in an n-well that is formed in the substrate.

22. The apparatus of claim 21, wherein the substrate is a P-type semiconductor, the n-well is an N-type semiconductor, and the p-tub is a P-type semiconductor.

23. The apparatus of claim 15, wherein the non-volatile memory cells are flash memory cells.

24. A method, comprising:
providing an erasing voltage differential to a first plurality of memory cells formed in a substrate; and
providing a compensating voltage differential to a second plurality of memory cells formed in the substrate, at approximately the same time as the erasing voltage differential is provided to the first plurality of memory cells.

25. The method of claim 24, wherein providing the erasing voltage differential comprises providing a first voltage to the first plurality of memory cells and a second voltage to the substrate.

26. The method of claim 25, wherein providing the compensating voltage differential comprises providing a third voltage to the second plurality of memory cells and the second voltage to the substrate.

27. The method of claim 26, wherein the third voltage is substantially equal to the second voltage.

28. The method of claim 24, further comprising selecting the first plurality of memory cells from an array of memory cells.

29. The method of claim 28, further comprising selecting the second plurality of memory cells from the array of memory cells.

30. The method of claim 24, wherein the non-volatile memory cells are flash memory cells.

31. A system, comprising:
a semiconductor memory array including a plurality of memory cells formed in a substrate;
a controller adapted to select a first plurality and a second plurality of memory cells, wherein the first and second pluralities of memory cells are formed in a first p-tub; and
a bias circuit adapted to provide an erasing voltage differential to the first plurality of memory cells and a compensating voltage differential to the second plurality of memory cells by providing a first voltage to the memory cells in the first plurality, a second voltage to the first p-tub, and a third voltage to the memory cells in the second plurality.

32. The apparatus of claim 31, wherein the erasing voltage differential is selected to substantially erase the first plurality of memory cells.

33. The apparatus of claim 32, wherein the erasing voltage differential is between about 10 and about 20 volts.

34. The apparatus of claim 33, wherein the erasing voltage differential is about 18 volts.

35. The system of claim 31, wherein the compensating voltage differential is substantially equal to zero and the third voltage is substantially equal to the second voltage.

36. The system of claim 31, wherein the memory cells are non-volatile memory cells.

37. The system of claim 36, wherein the non-volatile memory cells are flash memory cells.

38. An apparatus, comprising:

means for providing an erasing voltage differential to a first plurality of memory cells formed in a substrate; and means for providing a compensating voltage differential to a second plurality of memory cells formed in the substrate, at substantially the same time.

39. The apparatus of claim 38, wherein the means for providing an erasing voltage differential comprises a bias circuit.

40. The apparatus of claim 38, wherein the means for providing a compensating voltage differential comprises the bias circuit.

41. The apparatus of claim 38, wherein the means for providing an erasing voltage comprises a circuit adapted to apply a voltage of about −9 volts to a control gate of the first plurality of memory cells and a voltage of about +9 volts to the substrate.

42. The apparatus of claim 38, wherein the means for providing a compensating voltage comprises a circuit adapted to apply a voltage of about +9 volts to a control gate of the second plurality of memory cells and a voltage of about +9 volts to the substrate.

43. The apparatus of claim 38, wherein the non-volatile memory cells are flash memory cells.

44. A semiconductor memory device, comprising:

a semiconductor substrate;

a first doped region in the substrate;

a second doped region in the first doped region;

a first plurality of non-volatile memory cells formed in the second doped region;

a second plurality of memory cells formed in the second doped region;

a selection circuit coupled to the first and second pluralities of memory cells and adapted to select one of the first and second pluralities of memory cells and leave unselected the other of the first and second pluralities of memory cells; and a bias circuit coupled to the first and second pluralities of memory cells and adapted to apply an erasing potential to the selected plurality of memory cells and to apply a compensating potential to the unselected plurality of memory cells.

45. The semiconductor device of claim 44, wherein the semiconductor substrate comprises a P-type doping, the first region comprises an N-type doping, and the second region comprises a P-type doping.

46. The semiconductor device of claim 44, wherein the non-volatile memory cells comprise flash memory cells.

47. The semiconductor device of claim 44, wherein the erasing potential comprises a voltage of between about −6 volts and about −10 volts.

48. The semiconductor device of claim 44, wherein the compensating potential comprises a voltage of between about +6 volts and about +10 volts.

49. The semiconductor device of claim 47, wherein the erasing potential is approximately −9 volts.

50. The semiconductor device of claim 49, wherein the compensating voltage is approximately +9 volts.

51. The semiconductor device of claim 44, wherein the bias circuit is adapted to apply a voltage to the first doped region.

52. The semiconductor device of claim 51, wherein the voltage is between about +6 volts and about +10 volts.

53. The semiconductor device of claim 52, wherein the voltage is approximately +9 volts.

54. The semiconductor device of claim 52, wherein the voltage is approximately +9 volts, the erasing potential is approximately −9 volts, and the compensating voltage is approximately +9 volts.

55. The semiconductor device of claim 51, wherein the compensating potential is approximately equal to the voltage applied to the first doped region.

* * * * *